United States Patent
Schemm (10) Patent No.: US 11,614,478 B2
(45) Date of Patent: Mar. 28, 2023

(54) FAULT DETECTION CIRCUITS AND METHODS FOR DRIVERS

(71) Applicant: Texas Instruments Incorporated, Dallas, TX (US)

(72) Inventor: Nathan Richard Schemm, Rowlett, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 71 days.

(21) Appl. No.: 17/226,924

(22) Filed: Apr. 9, 2021

(65) Prior Publication Data

US 2022/0326296 A1 Oct. 13, 2022

(51) Int. Cl.
*G01R 31/26* (2020.01)
*H03K 17/687* (2006.01)
*H03K 5/24* (2006.01)

(52) U.S. Cl.
CPC ..... *G01R 31/2621* (2013.01); *G01R 31/2601* (2013.01); *H03K 5/24* (2013.01); *H03K 17/6871* (2013.01)

(58) Field of Classification Search
CPC .. G01R 31/2621; G01R 31/2601; H03K 5/24; H03K 17/6871
USPC .... 324/762.09, 762.08–762.9; 330/284, 144, 330/9
See application file for complete search history.

(56) References Cited

U.S. PATENT DOCUMENTS 8,331,072 B1 * 12/2012 Liu ...................... H03F 3/3022
361/93.7

* cited by examiner

*Primary Examiner* — Lee E Rodak
*Assistant Examiner* — Courtney G McDonnough
(74) *Attorney, Agent, or Firm* — Ray A. King; Frank D. Cimino (57) ABSTRACT

A fault detection circuit includes a short circuit comparison circuit which has a first input connected to the source of the second NFET, a second input, and an output. The circuit includes an over-current comparison circuit which has a first input connected to the source of the second NFET, a second input, and an output. The circuit includes a voltage divider circuit which has a first terminal connected to first input of the short circuit comparison circuit, a second terminal connected to the first input of the over-current comparison circuit, and a third terminal connected to a ground terminal. The circuit includes a delay circuit which has an input connected to the output of the over-current comparison circuit and has an output.

34 Claims, 5 Drawing Sheets

FAULT DETECTION CIRCUITS AND METHODS FOR DRIVERS

TECHNICAL FIELD

This description relates generally fault detection circuits and methods.

BACKGROUND

In switch mode regulators (e.g., buck regulator, boost regulator), a switch such as an n-channel field effect transistor (NFET) or a p-channel field effect transistor (PFET) is turned on and off at a high frequency to provide an output voltage. By varying the ratio of "on" to "off" time of the switch, the output voltage is regulated. The ratio of the "on" to "off" time is known as a duty cycle.

If the current drawn by a load coupled to a switch mode regulator rises suddenly, the current through a switch may rise above an over-current threshold, thereby causing an over-current fault. In the event of an over-current fault, the switch is turned off for the remainder of the on time period of the current cycle. However, because the over-current fault may only be transitory (e.g., few cycles) and the fault may clear itself when the current drawn by the load returns to a normal level, the switch is preferably turned on at the beginning of the next cycle and normal switching operation is resumed. Thus, if an over-current fault is detected, the switch is operated on a "cycle-by-cycle" mode.

If there is a short circuit in the regulator due to a control failure or an electrical failure, the current may shoot through the over-current threshold and also above a short circuit threshold, causing a short circuit fault. For example, an NFET may be rated with an over-current threshold of 70 A and a short circuit threshold of 100 A. Because a short circuit fault is not typically transitory and the switch can only tolerate a short circuit fault for a very brief period (e.g., 250 ns), operating the switch on a "cycle-by-cycle" mode can damage the switch. If a short circuit fault occurs, the switch is preferably completely latched-off and held in a latched-off state.

Existing switch mode regulators generally are not designed for both the "cycle-by-cycle" mode and the "latch-off" mode. Irrespective of the type of fault, existing regulators are designed to be run on a "cycle-by-cycle" mode or they can be completely latched-off. If a regulator provides the "latch-off" feature as its fault protection, completely latching-off the switch in the event of an over-current fault is not optimal. Conversely, if a regulator provides the "cycle-by-cycle" feature as its fault protection, running the switch on the "cycle-by-cycle" mode in the event of a short circuit fault will likely result in a catastrophic outcome.

SUMMARY

In one aspect, a fault detection circuit includes a first NFET which has a drain, a source, and a gate. The circuit includes a second NFET which has a drain connected to the drain of the first NFET, a gate connected to the gate of the first NFET, and a source. The circuit includes a sense resistor which has a first terminal connected to the source of the second NFET and a second terminal connected to the source of the first NFET. The circuit includes a current source configured to provide a reference current at an output. The circuit includes a short circuit comparison circuit which has a first input connected to the source of the second NFET, and includes a second input and an output. The circuit includes an over-current comparison circuit which has a first input connected to the source of the second NFET, and includes a second input and an output. The circuit includes a voltage divider circuit which has a first terminal connected to first input of the short circuit comparison circuit, a second terminal connected to the first input of the over-current comparison circuit, and a third terminal connected to a ground terminal. The circuit includes a delay circuit which has an input connected to the output of the over-current comparison circuit and has an output.

In an additional aspect, a sensed voltage proportional to a current through the first NFET is provided across the sense resistor. The voltage divider circuit is configured to apply a short circuit limit voltage to the first terminal of the short circuit comparison circuit and to apply an over-current limit voltage to the first terminal of the over-current comparison circuit.

In an additional aspect, the short circuit comparison circuit is configured to provide a short circuit fault signal when the sensed voltage is greater than the short circuit limit voltage, and the over-current comparison circuit is configured to provide an over-current fault signal when the sensed voltage is greater than the over-current limit voltage. The delay circuit is configured to provide a delayed over-current fault signal responsive to the over-current fault signal.

In an additional aspect, the voltage divider circuit includes a variable resistor which has a first terminal connected to the first input of the short circuit comparison circuit and a second terminal connected to the first input of the over-current comparison circuit. The voltage divider circuit includes a resistor which has a first terminal connected to the second terminal of the variable resistor and a second terminal connected to a ground terminal.

In an additional aspect, a fault detection circuit includes a first transistor which has first and second terminals and a gate. The circuit includes a second transistor which has a first terminal connected to the first terminal of the first transistor, and has a second terminal and a gate. The circuit includes a sense resistor which has a first terminal connected to the second terminal of the second transistor and a second terminal connected to the second terminal of the first transistor, and includes a current source configured to provide a reference current at an output. The circuit includes a short circuit comparison which has a first input connected to the second terminal of the second transistor, and has a second input and an output. The circuit includes an over-current comparison circuit which has a first input connected to the second terminal of the second transistor, and has a second input and an output. The circuit includes a voltage divider circuit which has a first terminal connected to first input of the short circuit comparison circuit, a second terminal connected to the first input of the over-current comparison circuit, and a third terminal connected to a ground terminal. The circuit includes a delay circuit having an input connected to the output of the over-current comparison circuit and an output. In an additional aspect, the first and second transistors are first and second PFETs, respectively. The first and second PFETs have respective sources connected together, the first and second PFETs have respective drains connected together, the first PFET has a drain, and the second PFET has a drain connected to the first terminal of the sense resistor.

In an additional aspect, a driver circuit includes a power NFET which has a drain, a source and a gate. The driver circuit includes a first NFET which has a drain connected to the source of the power NFET, a source, and a gate. The driver circuit includes a second NFET which has a drain connected to the source of the power NFET, a gate connected to the gate of the first NFET, and a source. The driver circuit includes a sense resistor which has a first terminal connected to the source of the second NFET and a second terminal connected to the source of the first NFET. The driver circuit includes a current source configured to provide a reference current at an output. The driver circuit includes a short circuit comparison circuit which has a first input connected to the source of the second NFET, a second input, and an output. The driver circuit includes an over-current comparison circuit which has a first input connected to the source of the second NFET, a second input, and an output. The driver circuit includes a voltage divider circuit which has a first terminal connected to first input of the short circuit comparison circuit, a second terminal connected to the first input of the over-current comparison circuit, and a third terminal connected to a ground terminal. The driver circuit includes a delay circuit which has an input connected to the output of the over-current comparison circuit and includes an output.

DETAILED DESCRIPTION

Figure 1:
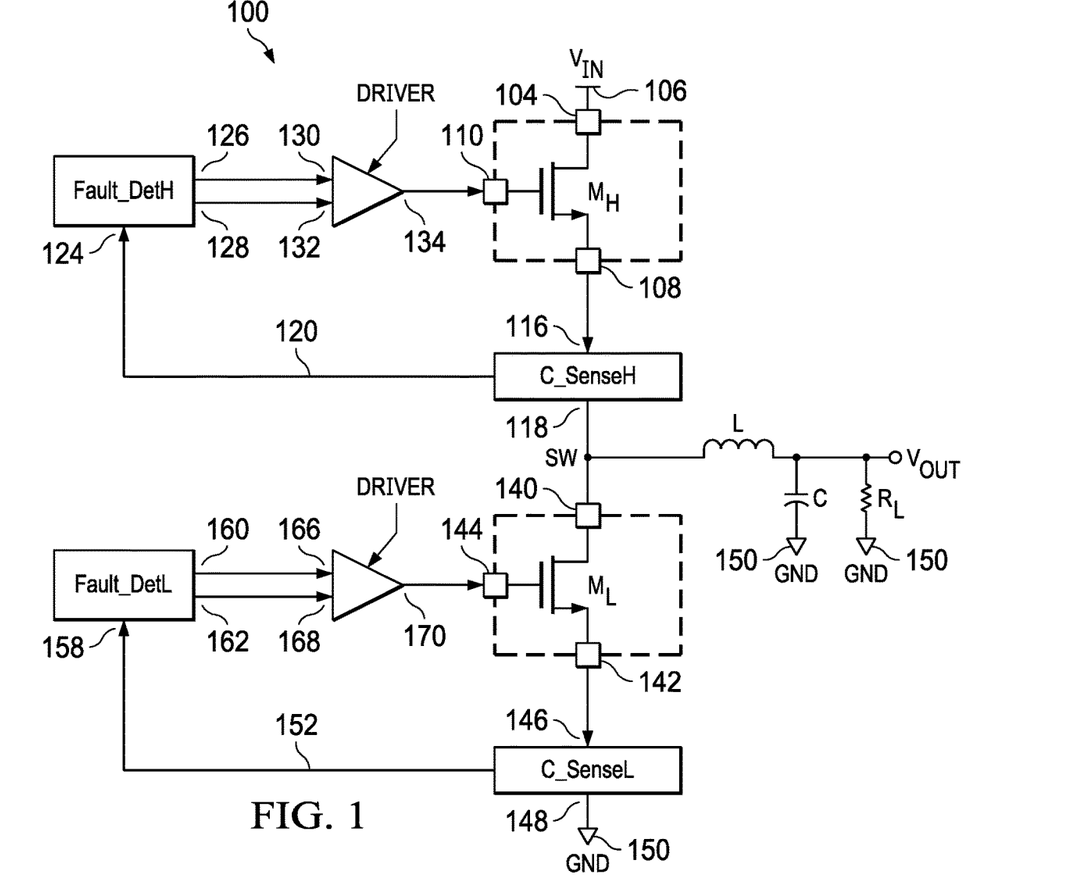
FIG. 1 is a block diagram of a switch mode regulator of an example embodiment.

FIG. 1 is a block diagram of a switch mode regulator 100 of an example embodiment.

The switch mode regulator 100 shown in FIG. 1 is a buck regulator. In other embodiments, the regulator may be a boost regulator, a buck-boost regulator, an LLC converter, or any other type of switch mode regulators.

The regulator 100 includes a high-side switch $M_H$ which has a first terminal 104 connected to an input voltage terminal 106, a second terminal 108, and a gate 110. The input voltage terminal 106 can be connected to an input voltage supply $V_{in}$.

The regulator 100 includes a high-side current sensor C_Sense$_H$ which has a first terminal 116 connected to the second terminal 108 of $M_H$, a second terminal 118 connected to a switching terminal SW (also known as a switching node), and an output 120. The regulator 100 includes a high-side fault detection circuit Fault_Det$_H$ which has an input 124 connected to the output 120 of C_Sense$_H$, and has a first output 126 and a second output 128. The regulator 100 includes a high-side driver Driver$_H$ which has a first input 130 connected to the first output 126 of the high-side fault detection circuit Fault_Det$_H$ and has a second input 132 connected to the second output 128 of the high-side fault detection circuit Fault_Det$_H$. The high-side driver Driver$_H$ has an output 134 connected to the gate 110 of $M_H$.

The regulator 100 includes a low-side switch $M_L$ which has a first terminal 140 connected to the switching terminal SW, and has a second terminal 142 and a gate 144. The regulator 100 includes a low-side current sensor C_Sense$_L$ which has a first terminal 146 connected to the second terminal 142 of the low side switch $M_L$, a second terminal 148 connected to a ground terminal 150, and an output 152. The ground terminal 150 can be connected to a ground voltage level.

The regulator 100 includes a low-side fault detection circuit Fault_Det$_L$ which has an input 158 connected to the output 152 of C_Sense$_L$, and has a first output 160 and a second output 162. The regulator 100 includes a low-side driver Driver$_L$ which has a first input 166 connected to the first output 160 of the low-side fault detection circuit Fault_Det$_L$ and has a second input 168 connected to the second output 162 of the low-side fault detection circuit Fault_Det$_L$. The low-side driver Driver$_L$ has an output 170 connected to the gate 144 of the low-side switch $M_L$.

The regulator 100 includes an inductor L connected between the switching terminal SW and a regulator output \T$_{out}$. A capacitor C is connected between \T$_{out}$ and the ground terminal 150, and a load represented by R$_L$ is connected between \T$_{out}$ and the ground terminal 150.

In an example embodiment, the high-side switch $M_H$ is an n-channel field effect transistor (NFET). The first terminal 104 of the NFET $M_H$ is the drain 104 and the second terminal 108 of the NFET $M_H$ is the source 108. The low-side switch $M_L$ is also an NFET of which the first terminal 140 is the drain 140 and the second terminal 142 is the source 142.

In operation, the high-side switch $M_H$ and the low-side switch $M_L$ are turned on/off in a complementary way. When $M_H$ is on and $M_L$ is off, $V_{in}$ is coupled to the switching terminal SW. As a result, current in the inductor L rises and flows to the load R$_L$, and the capacitor C is charged. When $M_H$ is off and $M_L$ is on, the switching terminal SW is coupled to the ground terminal 150. As a result, the current through the inductor Li falls, but continues to flow to the load R$_L$. During that time, the capacitor C supplies current to the load R$_L$ to compensate for the current demanded by R$_L$. Thus, when $M_H$ is on, the capacitor C is charged and when $M_L$ is on, the capacitor C provides the current to compensate for the imbalance due to: (a) the fall in the current through the inductor L; and (b) the current required to drive the load R$_L$.

The high-side current sensor C_Sense$_H$ is configured to provide a sensed voltage $V_{SENSE}$ which is proportional to, and representative of, the current flowing through the high-side switch $M_H$. The high-side fault detection circuit Fault_Det$_H$ receives $V_{SENSE}$. If $V_{SENSE}$ is greater than an over-current limit voltage $V_{SC\_LIM}$, the high-side fault detection circuit Fault_Det$_H$ generates an over-current fault signal OC$_{FAULT}$. The high-side fault detection circuit Fault_Det$_H$ applies a predetermined delay to OC$_{FAULT}$ and provides a delayed over-current fault signal DEL_OC$_{FAULT}$. If $V_{SENSE}$ is greater than a short circuit limit voltage $V_{OC\_LIM}$, the high-side fault detection circuit Fault_Det$_H$ provides a short circuit fault signal SC$_{FAULT}$.

The high-side driver Driver$_H$ controls the operation of the high-side switch $M_H$ by applying a pulse width modulated (PWM) signal to the gate 110 of $M_H$. The PWM signal has a duty cycle which describes the proportion of "on" time to the "off" time. By varying the duty cycle of the PWM signal, Driver$_H$ controls the "on" time and the "off" time of $M_H$.

In an example embodiment, the high-side driver Driver$_H$ receives the delayed over-current fault signal DEL_OC$_{FAULT}$ and the short circuit fault signal SC$_{FAULT}$. If the delayed over-current fault signal DEL_OC$_{FAULT}$ appears prior to the short circuit fault signal SC$_{FAULT}$, the condition is considered an over-current fault, and in response Driver$_H$ turns off the high-side switch $M_H$ for the remaining on time period of the current cycle, but turns on $M_H$ at start of the next cycle. For each occurrence of an over-current fault, Driver$_H$ turns off the high-side switch $M_H$ for the rest of the on time period of the current cycle, but turns on $M_H$ at the start of the next cycle. Thus, $M_H$ is operated on a cycle-by-cycle mode.

If the short circuit fault signal $SC_{FAULT}$ appears before the delayed over-current fault signal $DEL\_OC_{FAULT}$, the condition is considered a short circuit fault, and in response $Driver_H$ turns off the high-side switch $M_H$. In an example embodiment, the short circuit fault signal $SC_{FAULT}$ is provided to a main controller (not shown in FIG. 1). The main controller may completely shut down the regulator 100 by latching off both $M_H$ and $M_L$.

The low-side current sensor $C\_Sense_L$ is configured to provide a sensed voltage $V_{SENSE}$ which is proportional to, and is representative of, the current flowing through the low-side switch $M_H$. The low-side fault detection circuit $Fault\_Det_L$ receives $V_{SENSE}$. If $V_{SENSE}$ is greater than the over-current limit voltage $V_{SC\_LIM}$, $Fault\_Det_L$ generates the over-current fault signal $OC_{FAULT}$. The low-side fault detection circuit $Fault\_Det_L$ applies the predetermined delay to $OC_{FAULT}$ and provides the delayed over-current fault signal $DEL\_OC_{FAULT}$. If $V_{SENSE}$ is greater than a short circuit limit voltage $V_{OC\_LIM}$, the low-side fault detection circuit $Fault\_Det_L$ provides a short circuit fault $SC_{FAULT}$ signal.

The low-side driver $Driver_L$ receives the delayed over-current fault signal $DEL\_OC_{FAULT}$ and the short circuit fault signal $SC_{FAULT}$. If the delayed over-current fault signal $DEL\_OC_{FAULT}$ appears prior to the short circuit fault signal $SC_{FAULT}$, the condition is considered an over-current fault, and in response $Driver_L$ turns off the low-side switch $M_L$ for the rest of the on time period of the current cycle, but turns on $M_L$ at start of the next cycle. For each occurrence of an over-current fault, $Driver_L$ turns off the low-side switch $M_L$ for the rest of the on time period of the current cycle, but turns on $M_L$ at start of the next duty cycle. Thus, $M_H$ is operated on a cycle-by-cycle mode. If the short circuit fault signal $SC_{FAULT}$ appears before the delayed over-current fault signal $DEL\_OC_{FAULT}$, the condition is considered a short circuit fault, and in response $Driver_L$ turns off the low-side switch $M_L$. In response to $SC_{FAULT}$, the main controller (not shown in FIG. 1) may shut down the regulator 100 by latching off both $M_H$ and $M_L$.

Figure 2:
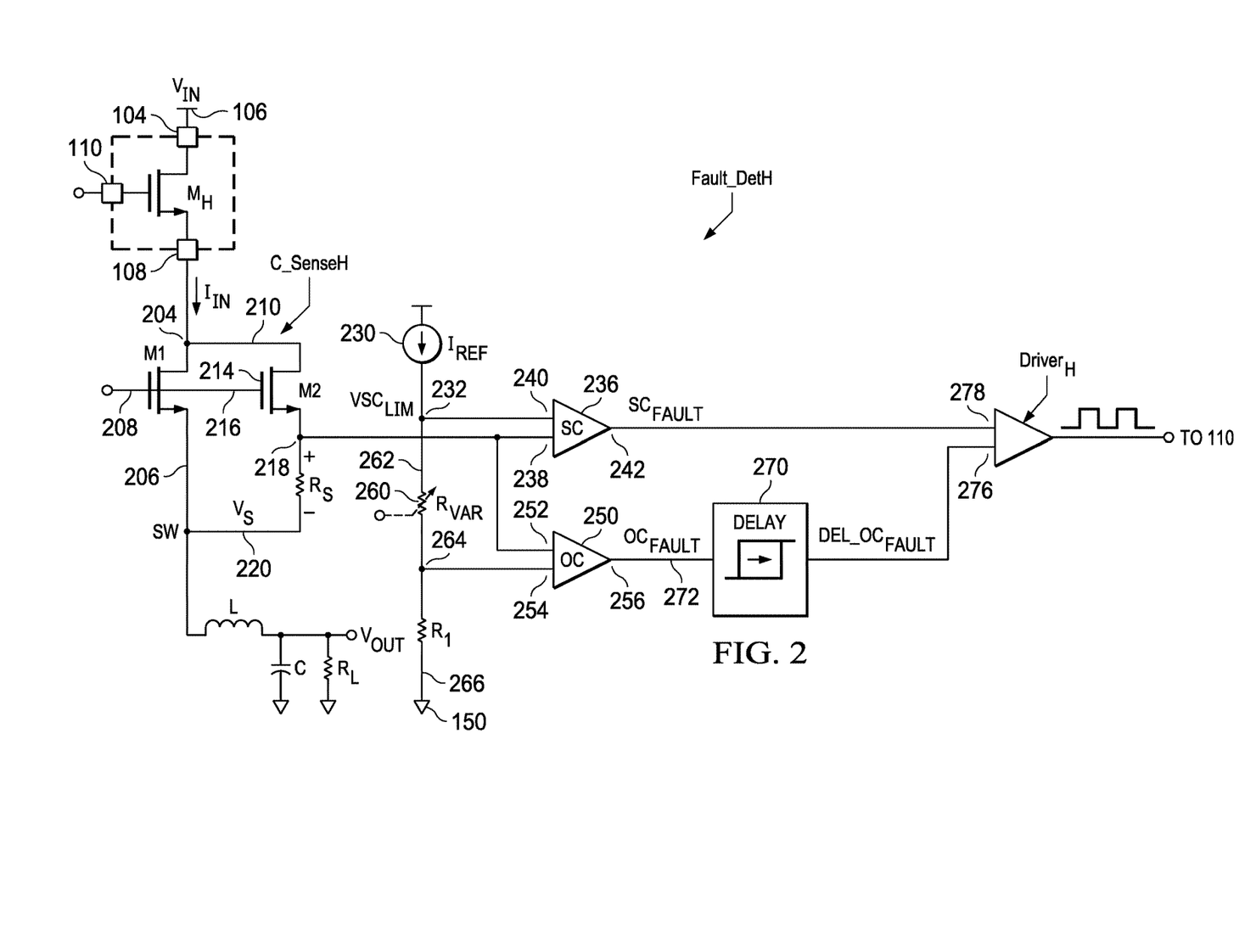
FIG. 2 is a schematic diagram of a regulator of an example embodiment.

FIG. 2 is a schematic diagram of: (1) the high-side switch $M_H$ (or the low-side switch ML); (2) the high-side current sense circuit $C\_Sense_H$ (or the low-side current sense circuit $C\_Sense_L$); and (3) the high-side fault detection circuit $Fault\_Det_H$ (or the low-side fault detection circuit $Fault\_Det_L$) of an example embodiment. The high-side switch $M_H$ can be a Gallium Nitride (GaN)-type NFET or a silicon-type NFET. The drain 104 of the NFET $M_H$ is connected to the input voltage terminal 106. The NFET $M_H$ has the source 108 and the gate 110. The high-side current sense circuit $C\_Sense_H$ includes NFETs M1 and M2 and a sense resistor $R_S$. The NFET M1 has a drain 204 connected to the source 108 of $M_H$, a source 206 connected to the switching terminal SW, and has a gate 208. The NFET M2 has a drain 210 connected to the drain 204 of M1 and has a gate 216 connected to the gate 208 of M1. The NFET M2 has a source 214. The sense resistor $R_S$ has a first terminal 218 connected to the source 214 of M2 and has a second terminal 220 connected to the source 206 of M1.

In an example embodiment, the NFETs M1 and M2 are sized such that M2 conducts only a small proportion of the current through M1. By way of example, M1 may be sized 1000 times larger than M2, thus allowing M2 to conduct only 1/1000th of the current through M1. In an example embodiment, M1 and M1 are turned on and are held in the on state during operation of the regulator 100.

In operation, when $M_H$ is on, an input current $I_{IN}$ flows from $V_{in}$ through $M_H$. Since M1 and M2 are both on, the input current $I_{IN}$ is shared between M1 and M2 based on the proportion of their sizes. If M1 is sized 1000 times bigger than M2, M2 will conduct only $1/1000^{th}$ of the current through M1. The portion of the current $I_{IN}$ which flows through M2 also flows through the sense resistor $R_S$, generating a sensed voltage $V_s$ across $R_S$. The sensed voltage $V_S$ is proportional to, and representative of, the input current $I_{IN}$ which flows through the high-side NFET $M_H$.

The fault detection circuit $Fault\_Det_H$ includes a reference current source 230 configured to provide a reference current $I_{REF}$ at an output 232. The fault detection circuit $Fault\_Det_H$ includes a short circuit comparison circuit 236 which has a first input 238 connected to the source 214 of the NFET M2 and has a second input 240 and an output 242.

The fault detection circuit $Fault\_Det_H$ includes an over-current comparison circuit 250 which has a first input 252 connected to the source 214 of the NFET M2. The over-current comparison circuit 250 has a second input 254 and an output 256.

The fault detection circuit $Fault\_Det_H$ includes a voltage divider circuit 260 which has a first terminal 262 connected to the output 232 of the reference current source 230 and connected to the second input 240 of the short circuit comparison circuit 236. The voltage divider circuit 260 has a second terminal 264 connected to the second input 254 of the over-current comparison circuit 250, and a third terminal 266 connected to the ground terminal 150.

The fault detection circuit $Fault\_Det_H$ includes a delay circuit 270 which has an input 272 connected to the output 256 of the over-current comparison circuit 250 and has an output 274.

The voltage divider circuit 260 is configured to apply a short circuit limit voltage $VSC_{LIM}$ to the second terminal 240 of the short circuit comparison circuit 236 and to apply an over-current limit voltage $VOC_{LIM}$ to the second input 254 of the over-current comparison circuit 250.

In an example embodiment, the voltage divider circuit 260 includes a variable resistor $R_{VAR}$ which has a first terminal connected to the second input 240 of the short circuit comparison circuit 236 and a second terminal connected to the second input 254 of the over-current comparison circuit 250. The voltage divider circuit 260 includes a resistor $R_1$ which has a first terminal connected to the second terminal of the variable resistor $R_{VAR}$ and a second terminal connected to the ground terminal 150.

The values of the variable resistor $R_{VAR}$ and the resistor $R_1$ are selected so that the short circuit limit voltage $VSC_{LIM}$ is representative of the short circuit current threshold of $M_H$ and the over-current limit voltage $VOC_{LIM}$ are representative of the over-current threshold of $M_H$. If, for example, the short circuit current threshold of $M_H$ is 100 A and the over-current threshold of $M_H$ is 70 A, the resistors $R_{VAR}$ and $R_1$ can be selected so that $VSC_{LIM}$ is 100 mV and $VOC_{LIM}$ is 70 mV.

If the sensed voltage $V_S$ is greater than $VO_{CLIM}$, the over-current comparison circuit 250 is configured to provide an over-current fault signal $OC_{FAULT}$. If the sensed voltage $V_S$ is greater than $VSC_{LIM}$, the short circuit comparison circuit 236 is configured to provide a short circuit fault signal $SC_{FAULT}$. In an example embodiment, the short circuit comparison circuit 236 and the over-current comparison circuit 250 are implemented with analog comparators with matched propagation delays.

The delay circuit 270 applies a predetermined time delay to the over-current fault signal $OC_{FAULT}$ and provides a delayed over-current fault signal $DEL\_OC_{FAULT}$.

The high-side driver $Driver_H$ has a first input 276 configured to receive the delayed over-current fault signal $DEL\_OC_{FAULT}$ and has a second input 278 configured to receive the short circuit fault signal $SC_{FAULT}$. If the delayed over-current fault signal $DEL\_OC_{FAULT}$ appears prior to the short circuit fault signal $SC_{FAULT}$, the condition is considered an over-current fault, and in response the high-side driver $Driver_H$ turns off the high-side switch $M_H$ for the remainder of the on time period of the current cycle, but turns on $M_H$ at start of the next cycle. For each over-current fault, $Driver_H$ turns off the high-side switch $M_H$ for the rest of the on time period of the current cycle, but turns on $M_H$ at start of the next cycle. Thus, $M_H$ is operated in a cycle-by-cycle mode. If the short circuit fault signal $SC_{FAULT}$ appears before the delayed over-current fault signal $DEL\_OC_{FAULT}$, the condition is considered a short circuit fault, and in response $Driver_H$ turns off the high-side switch $M_H$. The short circuit fault signal $SC_{FAULT}$ is provided to a main controller (not shown in FIG. 2). The main controller may shut down the regulator 100 by turning off both $M_H$ and $M_L$.

In another example embodiment, the high-side current sense circuit $C\_Sense_H$ (or the low-side current sense circuit $C\_Sense_L$) can be implemented with p-channel field effect transistors (PFETs). In that embodiment, M1 is a PFET whose source is connected to the source 108 of $M_H$ and whose drain is connected to the switching terminal SW. Also, M2 is a PFET whose source is connected to the first terminal 218 of the sense resistor $R_S$ and whose drain is connected to the drain of M1. The gates of M1 and M2 are interconnected.

Figure 3:
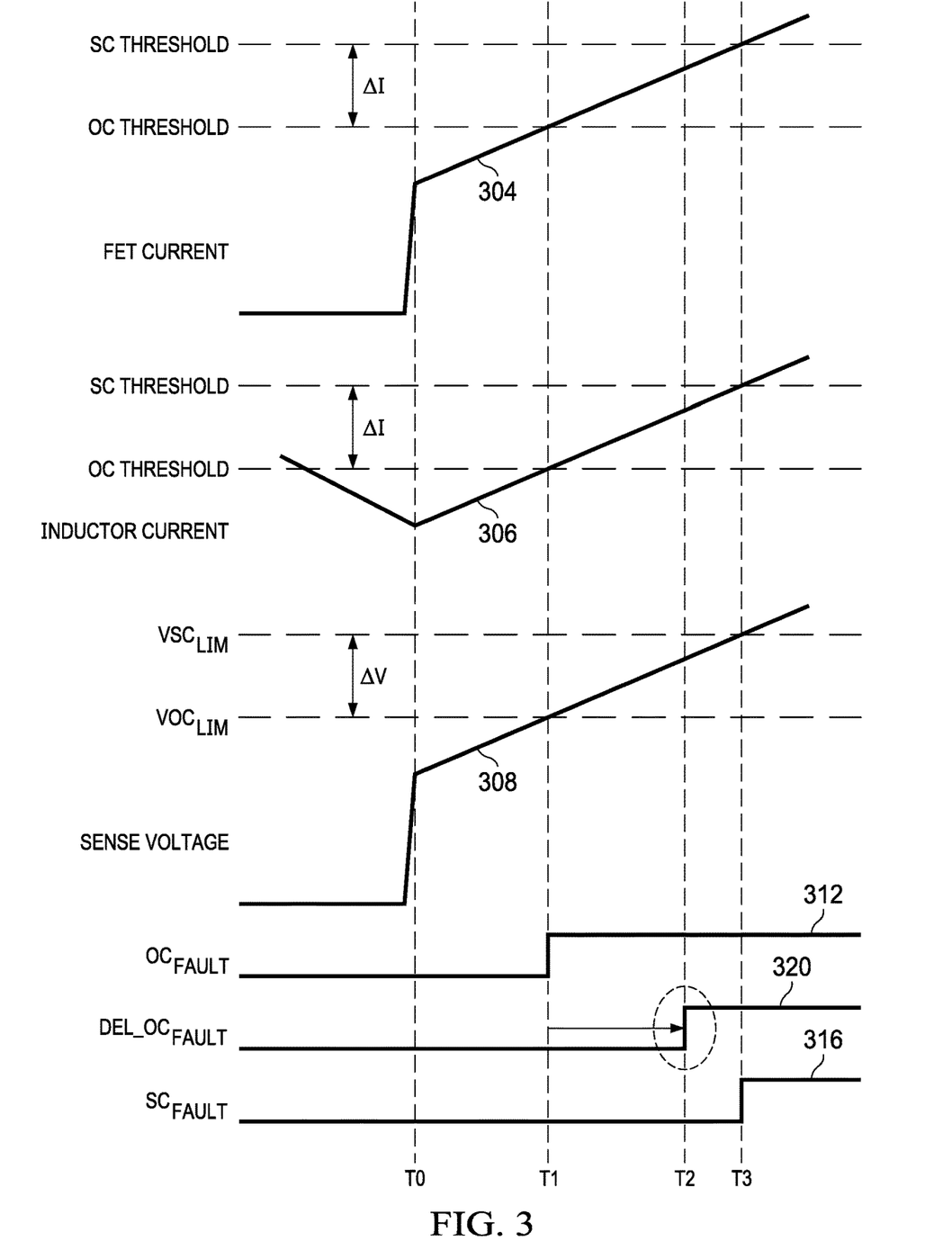
FIGS. 3-4 illustrate waveforms of the regulator of FIG. 2.

FIG. 3 illustrates various waveforms when $DEL\_OC_{FAULT}$ appears before $SC_{FAULT}$. The waveforms are: current 304 through $M_H$; current 306 through the inductor L; sensed voltage $V_S$ 308 across $R_S$; over-current fault signal $OC_{FAULT}$ 312 provided by the over-current comparison circuit 250; short circuit fault signal $SC_{FAULT}$ 316 provided by the short circuit comparison circuit 236; and delayed over-current fault signal $DEL\_OC_{FAULT}$ 320 provided by the delay circuit 270.

At time T0, the high-side NFET $M_H$ is turned on, thus coupling the inductor L to $V_{IN}$. The current 304 through $M_H$ rises to a level that is equal to the current flowing through the inductor L. As the current 306 through the inductor L continues to rise, $V_s$ 308 rises proportionally. At time T1, $V_s$ 308 rises above $VOC_{LIM}$, thus indicating that the current 304 through $M_H$ has risen above the over-current threshold limit of $M_H$. As a result, the over-current comparison circuit 250 provides $OC_{FAULT}$ 312. At time T2, the delay circuit 270 applies a predetermined delay to $OC_{FAULT}$ 312 and provides $DEL\_OC_{FAULT}$ 320. The current 304 continues to rise through $M_H$ and at time T3, $V_S$ rises above $VSC_{LIM}$, thus indicating that the current 304 through $M_H$ has risen above the short circuit current threshold of $M_H$. As a result, the short circuit comparison circuit 236 provides $SC_{FAULT}$ 316. Since, $DEL\_OC_{FAULT}$ 320 appears before $SC_{FAULT}$ 316, the condition is considered an over-current fault, and accordingly the driver $DRIVER_H$ turns off $M_H$ for the rest of the on time of the current cycle and operates $M_H$ in a cycle-by-cycle mode.

Figure 4:
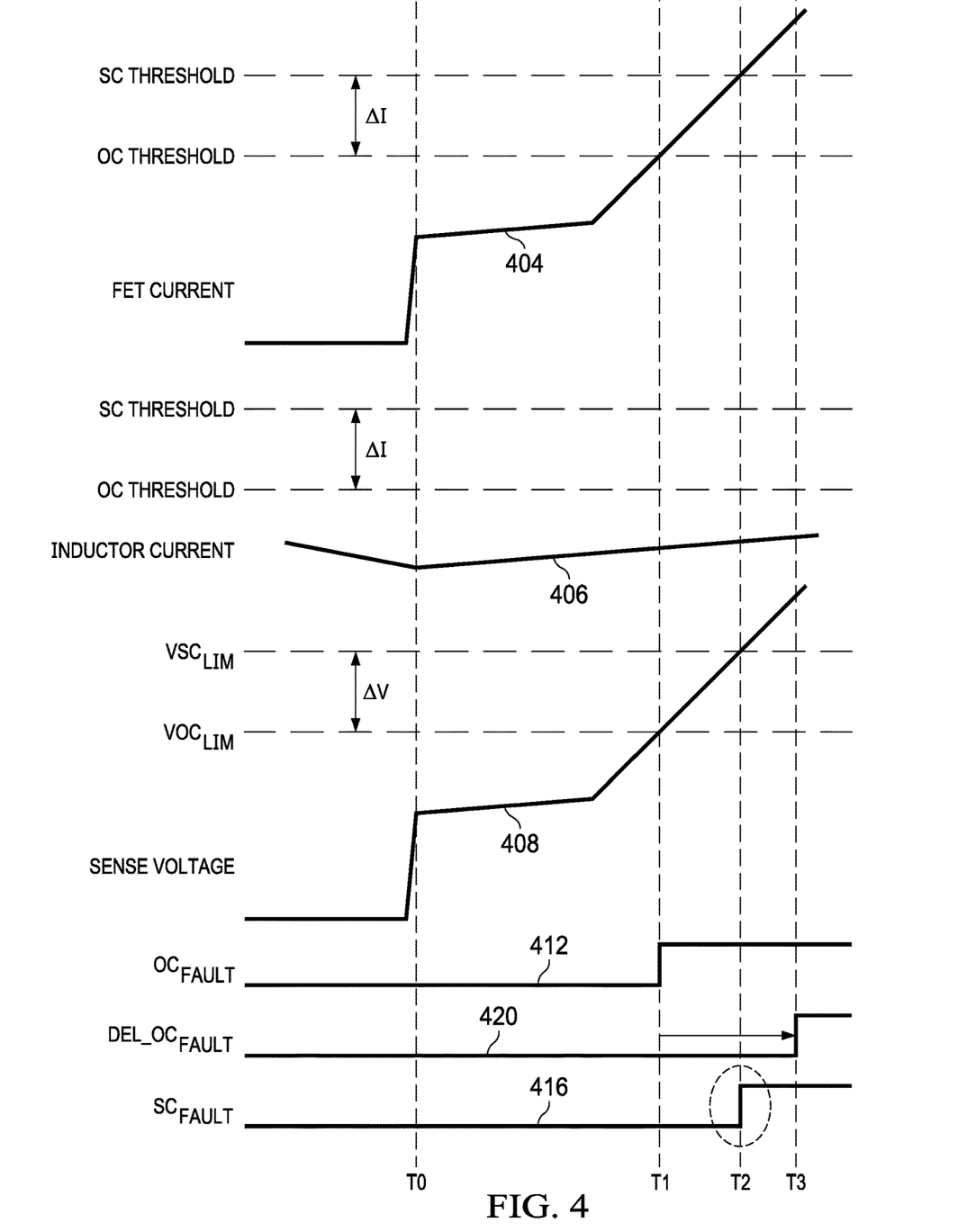

FIG. 4 illustrates various waveforms when $SC_{FAULT}$ appears before $DEL\_OC_{FAULT}$. The waveforms are: current 404 through $M_H$; current 406 through the inductor; sensed voltage $V_S$ 408 across $R_S$; over-current fault signal $OC_{FAULT}$ 412 provided by the over-current comparison circuit 250; short circuit fault signal $SC_{FAULT}$ 416 provided by the short circuit comparison circuit 236; and delayed over-current fault signal $DEL\_OC_{FAULT}$ 420 provided by the delay circuit 270.

At time T0, the high-side NFET $M_H$ is turned on. As a result the current 404 through $M_H$ rises to a level that is equal to the current flowing through the inductor L. As the current 406 through the inductor L continues to rise, $V_s$ rises proportionally.

At time T1, $V_S$ 408 rises above $VOC_{LIM}$, thus indicating that the current 404 through $M_H$ has risen above the over-current threshold limit of $M_H$. As a result, the over-current comparison circuit 250 provides $OC_{FAULT}$ 412. The delay circuit 270 applies a predetermined delay to $OC_{FAULT}$ 412 and provides $DEL\_OC_{FAULT}$ 420 at time T3. However, prior to T3, at time T2, the current 404 rises above the short circuit current threshold of $M_H$, causing $V_S$ to rise above $VSC_{LIM}$. As a result, the short circuit comparison circuit 236 provides $SC_{FAULT}$ 420 at T2. Since, $SC_{FAULT}$ 416 appears prior to $DEL\_OC_{FAULT}$ 420, the condition is considered a short circuit fault. Accordingly the driver $DRIVER_H$ turns off $M_H$. Also, as discussed before, a main controller may in response to the short circuit fault shut down the regulator 100.

As discussed before, the values of the resistor $R_1$ and the variable resistor $R_{VAR}$ of the voltage divider circuit are selected to set the over-current limit voltage $VOC_{LIM}$ and the short circuit limit voltage $VSC_{LIM}$. By varying $R_{VAR}$, the separation between $VOC_{LIM}$ and $VSC_{LIM}$ is varied. If the value of $R_{VAR}$ is increased, $VSC_{LIM}$ is moved away (higher) from $VOC_{LIM}$, which provides less protection from catastrophic short circuit failure. Conversely, if the value of $R_{VAR}$ is decreased, $VSC_{LIM}$ is moved closer to $VOC_{LIM}$, which provides increased protection from catastrophic short circuit failure but increases the frequency of regulator shut downs.

Because the sensed voltage $V_s$ is proportional to the current through $M_H$ (or $M_L$), the rate of change $dV_s/dt$ is proportional to $di/dt$. If $di/dt$ is high, $dV_s/dt$ is also high. As a consequence, $V_S$ rises quickly above $VOC_{LIM}$, thereby triggering $OC_{FAULT}$ and then quickly rises above $SC_{LIM}$, thereby triggering $SC_{FAULT}$ before $DEL\_OC_{FAULT}$ appears. Conversely, if $di/dt$ is low, $V_S$ slowly rises above $OC_{LIM}$, thereby triggering $OC_{FAULT}$, but due to the low $di/dt$ $DEL\_OC_{FAULT}$ appears before $SC_{FAULT}$.

Figure 5:
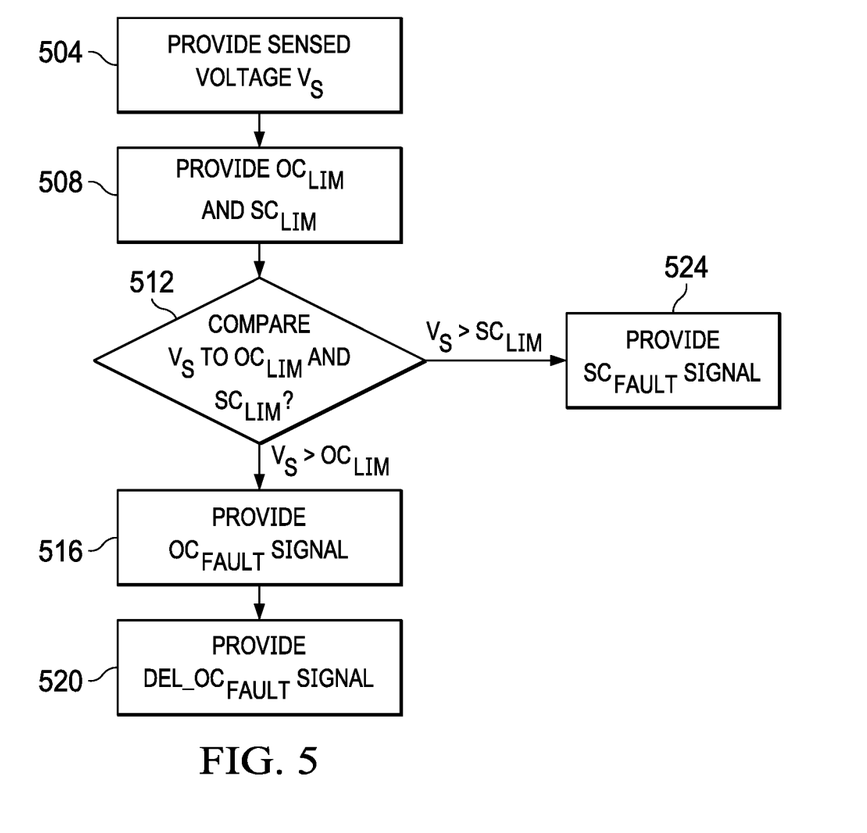
FIG. 5 is a flow diagram of a method of an example embodiment.

FIG. 5 is a flow diagram of a method of an example embodiment. In a block 504, a sensed voltage which is proportional to a current through a transistor is provided. In a block 508, a short circuit limit voltage and an over-current limit voltage are provided. In a block 512, the sensed voltage is compared to the short circuit limit voltage and the over-current limit voltage.

If the sensed voltage is greater than the over-current limit voltage, in a block 516 an over-current fault signal is provided. In a block 520, a delayed over-current fault signal is provided by applying a delay to the over-current fault signal. If the sensed voltage is greater than the short circuit limit voltage, in a block 524 a short circuit fault signal is provided. If the short circuit fault signal appears prior to the delayed over-current fault signal, the condition is considered a short circuit fault and accordingly the transistor is latched off. If the delayed over-current fault signal appears prior to the short circuit fault signal, the condition is considered an over-current fault, and the transistor is turned off during the remainder of the current cycle, but is turned on at the beginning of the next cycle.

Modifications are possible in the described embodiments, and other embodiments are possible, within the scope of the claims.

What is claimed is:

1. A fault detection circuit, comprising:
a first n-channel field effect transistor (NFET) having a first drain, a first source, and a first gate;
a second NFET having a second drain, a second source and a second gate, wherein the second drain is connected to the first drain, and the second gate is connected to the first gate;
a sense resistor coupled between the second source and the first source;
a current source configured to provide a reference current at a current output;
a short circuit comparison circuit having a short circuit output and first and second short circuit inputs, wherein the first short circuit input is connected to the second source;
an over-current comparison circuit having an over-current output and first and second over-current inputs, wherein the first over-current input is connected to the second source;
a voltage divider circuit having first, second and third voltage divider terminals, wherein the first voltage divider terminal is connected to the first short circuit input, the second voltage divider terminal is connected to the first over-current input, and the third voltage divider terminal is connected to a ground terminal; and
a delay circuit having a delay input and a delay output, wherein the delay input is connected to the over-current output.

2. The fault detection circuit of claim 1, wherein a sensed voltage proportional to a current through the first NFET is provided across the sense resistor.

3. The fault detection circuit of claim 1, wherein the voltage divider circuit is configured to apply a short circuit limit voltage to the first short circuit input.

4. The fault detection circuit of claim 1, wherein the voltage divider circuit is configured to apply an over-current limit voltage to the first over-current input.

5. The fault detection circuit of claim 3, wherein the short circuit comparison circuit is configured to provide a short circuit fault signal when the sensed voltage is greater than the short circuit limit voltage.

6. The fault detection circuit of claim 4, wherein the over-current comparison circuit is configured to provide an over-current fault signal when the sensed voltage is greater than the over-current limit voltage.

7. The fault detection circuit of claim 6, wherein the delay circuit is configured to provide a delayed over-current fault signal responsive to the over-current fault signal.

8. The fault detection circuit of claim 1, wherein the voltage divider circuit comprises:
a variable resistor coupled between the first short circuit input and the first over-current input; and
a resistor coupled between the first over-current input and the ground terminal.

9. The fault detection circuit of claim 1, wherein the first source is connected to a switching terminal.

10. The fault detection circuit of claim 1, wherein the first source is connected to the ground terminal.

11. A fault detection circuit, comprising:
a first transistor having first and second current terminals and a first gate;
a second transistor having third and fourth current terminals and a second gate, wherein the third current terminal is coupled to the first current terminal;
a sense resistor coupled between the second current terminal and the fourth current terminal;
a current source configured to provide a reference current at a current output;
a short circuit comparison circuit having a short circuit output and first and second short circuit inputs, wherein the first short circuit input is connected to the fourth current terminal;
an over-current comparison circuit having an over-current output and first and second over-current inputs, wherein the first over-current input is connected to the fourth current terminal;
a voltage divider circuit having first, second and third divider terminals, wherein the first divider terminal is connected to the first short circuit input, the second divider terminal is connected to the first over-current input, and the third divider terminal is connected to a ground terminal; and
a delay circuit having a delay input and a delay output, wherein the delay input is connected to the over-current output.

12. The fault detection circuit of claim 11, wherein the first and second transistors are first and second p-channel field effect transistors (PFETs), respectively, the first and third current terminals connected together, the second and fourth current terminals connected together, and the fourth current terminal connected to the sense resistor.

13. The fault detection circuit of claim 11, wherein a sensed voltage proportional to a current through the first transistor is provided across the sense resistor.

14. The fault detection circuit of claim 11, wherein the voltage divider circuit is configured to provide a short circuit limit voltage to the first short circuit input.

15. The fault detection circuit of claim 11, wherein the voltage divider circuit is configured to provide an over-current limit voltage to the first over-current input.

16. The fault detection circuit of claim 14, wherein the short circuit comparison circuit is configured to provide a short circuit fault signal when the sensed voltage is greater than the short circuit limit voltage.

17. The fault detection circuit of claim 15, wherein the over-current comparison circuit is configured to provide an over-current fault signal when the sensed voltage is greater than the over-current limit voltage.

18. The fault detection circuit of claim 17, wherein the delay circuit is configured to provide a delayed over-current fault signal responsive to the over-current fault signal.

19. The fault detection circuit of claim 11, wherein the voltage divider circuit comprises:
a variable resistor coupled between the first short circuit input and the first over-current input; and
a resistor coupled between the first over-current input and the ground terminal.

20. The fault detection circuit of claim 11, wherein the second current terminal is connected to a switching terminal.

21. The fault detection circuit of claim 11, wherein the second current terminal is connected to the ground terminal.

22. A driver circuit, comprising:
a power n-channel field effect transistor (NFET) having a drain, a source, and a gate;
a first NFET having a drain, a source and a gate, wherein the drain is connected to the source of the power NFET;

a second NFET having a drain, a source and a gate, wherein the drain is connected to the source of the power NFET, and the gate is connected to the gate of the first NFET;

a sense resistor coupled between the source of the second NFET and the source of the first NFET;

a current source configured to provide a reference current at a current output;

a short circuit comparison circuit having a short circuit output and first and second short circuit inputs, wherein the first short circuit input is connected to the source of the second NFET;

an over-current comparison circuit having an over-current output and first and second over-current inputs, wherein the first over-current input is connected to the source of the second NFET;

a voltage divider circuit having first, second and third divider terminals, wherein the first divider terminal is connected to the first short circuit input, the second divider terminal connected to the first over-current input, and the third divider terminal connected to a ground terminal; and a delay circuit having a delay input and a delay output, wherein the delay input is connected to the over-current output.

23. The driver circuit of claim 22, wherein a sensed voltage proportional to a current through the power NFET is provided across the sense resistor.

24. The driver circuit of claim 22, wherein the power NFET is a low-side NFET, and the drain of the power NFET is connected to a switching terminal.

25. The driver circuit of claim 22, wherein the power NFET is a high-side NFET, and the drain of the power NFET is connected to a power supply terminal.

26. The driver circuit of claim 22, wherein the source of the first NFET is connected to a switching terminal.

27. The driver circuit of claim 22, wherein the source of the first NFET is connected to a ground terminal.

28. The driver circuit of claim 22, wherein the voltage divider circuit is configured to provide a short circuit limit voltage to the first short circuit input.

29. The driver circuit of claim 22, wherein the voltage divider circuit is configured to provide an over-current limit voltage to the first over-current input.

30. The driver circuit of claim 28, wherein the short circuit comparison circuit is configured to provide a short circuit fault signal when the sensed voltage is greater than the short circuit limit voltage.

31. The driver circuit of claim 29, wherein the over-current comparison circuit is configured to provide an over-current fault signal when the sensed voltage is greater than the over-current limit voltage.

32. The driver circuit of claim 31, wherein the delay circuit is configured to provide a delayed over-current fault signal responsive to the over-current fault signal.

33. A method of fault detection, comprising:

providing a sensed voltage proportional to a current through a transistor;

providing a short circuit limit voltage;

providing an over-current limit voltage;

comparing the sensed voltage to the short circuit limit voltage and the over-current limit voltage;

providing a short circuit fault signal responsive to the sensed voltage being greater than the short circuit limit voltage;

providing an over-current fault signal responsive to the sensed voltage being greater than the over-current limit voltage;

providing a delayed over-current fault signal by applying a delay to the over-current fault signal; and turning the transistor off responsive to the short circuit fault signal occurring prior to the delayed over-current fault signal.

34. The method of claim 33, further comprising turning off the transistor during a remainder of a current duty cycle and turning on the transistor in a next duty cycle responsive to if the delayed over-current fault signal occurring prior to the short circuit fault signal.

* * * * *